US012028021B2

(12) United States Patent
Chakraborty et al.

(10) Patent No.: US 12,028,021 B2
(45) Date of Patent: Jul. 2, 2024

(54) CURRENT MODE SIGNAL PATH OF AN INTEGRATED RADIO FREQUENCY PULSE GENERATOR

(71) Applicant: International Business Machines Corporation, Armonk, NY (US)

(72) Inventors: Sudipto Chakraborty, Plano, TX (US); David James Frank, Yorktown Heights, NY (US); John Francis Bulzacchelli, Somers, NY (US); Rajiv Joshi, Yorktown Heights, NY (US); Daniel Joseph Friedman, Sleepy Hollow, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/354,718

(22) Filed: Jun. 22, 2021

(65) Prior Publication Data
US 2022/0407460 A1 Dec. 22, 2022

(51) Int. Cl.
| H03D 7/14 | (2006.01) |
| H03D 3/00 | (2006.01) |
| H03M 1/66 | (2006.01) |
| H04B 1/00 | (2006.01) |

(52) U.S. Cl.
CPC ........... *H03D 7/1458* (2013.01); *H03D 3/008* (2013.01); *H03D 7/1441* (2013.01); *H03M 1/66* (2013.01); *H04B 1/0007* (2013.01); *H03D 2200/0033* (2013.01); *H03D 2200/0047* (2013.01); *H03D 2200/009* (2013.01)

(58) Field of Classification Search
CPC ........... H03K 5/00; H03K 2005/00013; H03K 2005/00019; H03K 2005/00026; H03K 2005/00058; H03K 2005/00065
See application file for complete search history.

(56) References Cited

U.S. PATENT DOCUMENTS

| 6,930,627 B1 | 8/2005 | Hopkins |
| 8,073,078 B2 | 12/2011 | Kaczman et al. |
| 8,203,653 B2 | 6/2012 | Yun et al. |
| 8,380,157 B2 | 2/2013 | Zhang et al. |

(Continued)

FOREIGN PATENT DOCUMENTS

| CN | 101729079 B | 11/2012 |
| CN | 101604984 B | 1/2013 |

OTHER PUBLICATIONS

Patra et. al, "A Scalable Cryo-CMOS 2-to-20GHz Digitally Intensive Controller for 4x32 Frequency Multiplexed Spin Qubits/Transmons in 22nm FinFET Technology for Quantum Computers" ISSCC 2020.

(Continued)

*Primary Examiner* — Diana J. Cheng
(74) *Attorney, Agent, or Firm* — Amin, Turocy & Watson, LLP

(57) ABSTRACT

A current mode end-to-end signal path includes, a digital to analog converter (DAC), operating in current mode and an upconverting mixer, operating in current mode and operatively coupled to the DAC, wherein analog inputs and analog outputs of the DAC and the upconverting mixer are represented as currents, and the DAC generates a baseband signal.

22 Claims, 10 Drawing Sheets

(56) References Cited

U.S. PATENT DOCUMENTS

| | | | |
|---|---|---|---|
| 8,526,896 B2 * | 9/2013 | Nielsen | H04B 1/30 |
| | | | 455/114.3 |
| 8,693,961 B2 | 4/2014 | Oliaei et al. | |
| 10,891,719 B2 * | 1/2021 | Srivastava | G06F 17/148 |
| 2010/0066442 A1 | 3/2010 | Mu | |

OTHER PUBLICATIONS

Bardin et. Al, "A 28nm Bulk-CMOS 4-to-8GHZ i2mW Cryogenic Pulse Modulator for Scalable Quantum Computing" ISSCC 2019.

Mell et al., "The NIST Definition of Cloud Computing," Recommendations of the National Institute of Standards and Technology, NIST Special Publication 800-145, Sep. 2011, 7 pages.

International Search Report and Written Opinion received for International PCT Application Serial No. PCT/EP2022/066773 dated Oct. 11, 2022, 15 pages.

Bardin et al., "Design and Characterization of a 28-nm Bulk-CMOS Cryogenic Quantum Controller Dissipating Less Than 2 mW at 3 K", IEEE Journal of Solid-State Circuits, vol. 54, No. 11, Nov. 2019, pp. 3043-3060.

Taleie et al., "A Linear Σ-Δ Digital if to RF DAC transmitter with embedded mixer", IEEE Transactions on Microwave Theory and Techniques, vol. 56, No. 5, May 2008, pp. 1059-1068.

Bishnu, et al., "19.1 A Scalable Cryo-CMOS 2-to-20GHz Digitally Intensive Controller for 4x32 Frequency Multiplexed Spin Qubits/Transmons in 22nm FinFET Technoology for Qunatum Computers," 2020 IEEE International Solid- State Circuits Conference—(ISSCC), IEEE, Feb. 16, 2020 (Feb. 16, 2020), pp. 304-306, XP033754481, DOI: 10.1109/ISSCC19947.2020.9063109 [retrieved on Apr. 9, 2020], p. 3049, col. 2, para 1; figures 7,8,12.

* cited by examiner

CURRENT MODE SIGNAL PATH OF AN INTEGRATED RADIO FREQUENCY PULSE GENERATOR

TECHNICAL FIELD

The subject disclosure relates to an integrated radio frequency (RF) pulse generator and more specifically, utilizing a current mode end-to-end signal path to reduce power consumption and enhance linearity between a digital to analog converter (DAC) and adjacent stages in a signal chain.

BACKGROUND

Quantum computing is generally the utilization of quantum-mechanical phenomena to perform computing and information processing functions. Quantum computing can be viewed in contrast to classical computing, which generally operates on binary values with transistors. That is, while classical computers can operate on two basis states that are either 0 or 1, quantum computers operate on quantum bits ("qubits") that comprise superposition of both 0 and 1 based on probability, can entangle multiple quantum bits, and utilize interference. Quantum computing is emerging as a new paradigm to solve a wide class of problems that show unfavorable scaling on a conventional classical high-performance computer. Arbitrary waveform generation capability with variable amplitude and low distortion is desirable in multiple contexts, including in control of qubits in the field of quantum computing. A key circuit in an arbitrary waveform generator (AWG) is a digital to analog converter (DAC), which is valuable in a variety of applications, including wireless transmitters and implementing qubit control pulses. Minimizing power consumption for such designs is valuable, especially in context of cryogenic signal generation for qubit control. There are some challenges with designs that utilize voltage mode representations for a signal path, which include high dynamic range requirements at block interfaces, leading to non-linear behavior and the generation of undesired distortion products. Another challenge is significant power consumption per block, with no opportunity for power efficiency that comes from current reuse.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate an integrated radio frequency pulse generator system, and more specifically, utilizing a current mode end-to-end signal path to reduce power consumption and enhance linearity between a digital to analog converter (DAC) and subsequent stages in a signal chain. This can facilitate realization of a favorable set of trade-offs regarding power consumption and distortion.

In accordance with an embodiment, a system for generating a radio-frequency signal comprises: a digital to analog converter (DAC) operating in current mode; and an upconverting mixer, operating in current mode and operatively coupled to the DAC, wherein analog inputs and analog outputs of the DAC and the upconverting mixer are represented as currents, and the DAC generates a baseband signal.

In accordance with an aspect, the system further comprises a radio frequency (RF) attenuator, operating in current mode, with the DAC and the upconverting mixer.

In accordance with an aspect, the system further comprises an output component, operating in current mode, with the DAC, the upconverting mixer and the RF attenuator.

In accordance with an aspect, the system further comprises an offset component that applies current mode offset cancellation to facilitate local oscillator (LO) leakage signal reduction.

In accordance with an aspect, at least one of the DAC, the upconverting mixer, the output component, the RF attenuator or the offset component is a cryo-electronic component.

In an embodiment, a system for generating a radio-frequency signal, comprises: a digital to analog converter (DAC) operating in current mode; and a baseband filter and an upconverting mixer, operating in current mode and operatively coupled to the DAC, wherein analog inputs and analog outputs of the DAC, the baseband filter and the upconverting mixer are represented as currents, and the DAC generates a baseband signal.

In accordance with an aspect, the system further comprises a radio frequency (RF) attenuator, operating in current mode, with the DAC, the baseband filter and the upconverting mixer.

In accordance with an aspect, the system further comprises an output component, operating in current mode, with the DAC, the baseband filter, the upconverting mixer and the RF attenuator.

In accordance with an aspect, the system further comprises an offset component that applies current mode offset cancellation to facilitate local oscillator (LO) leakage signal reduction.

In accordance with an aspect of the system, at least one of: the DAC, the baseband filter, the upconverting mixer, the RF attenuator, the output component, or the offset component is a cryo-electronic component.

In accordance with an aspect, the system further comprises two or more DACs in quadrature, two or more upconverting mixers in quadrature and a summer that generates a summed output of respective output signals of the upconverting mixers.

In accordance with an embodiment, a method comprises: using a digital to analog converter (DAC) operating in current mode; and using an upconverting mixer, operating in current mode and operatively coupled to the DAC, wherein analog inputs and analog outputs of the DAC and the upconverting mixer are represented as currents, and the DAC generates a baseband signal.

In accordance with an aspect, the method further comprises using a radio frequency (RF) attenuator, operating in current mode, with the DAC and the upconverting mixer.

In accordance with an aspect, the method further comprises using an output component, operating in current mode, with the DAC, the upconverting mixer and the RF attenuator.

In accordance with an aspect, the method further comprises using an offset component that applies current mode offset cancellation to facilitate local oscillator (LO) leakage signal reduction.

In accordance with an aspect, at least one of the DAC, the upconverting mixer, the output component, the RF attenuator or the offset component is a cryo-electronic component.

In an embodiment, a method comprises: using a digital to analog converter (DAC) operating in current mode; and using a baseband filter and an upconverting mixer, operating in current mode and operatively coupled to the DAC, wherein analog inputs and analog outputs of the DAC, the baseband filter and the upconverting mixer are represented as currents, and the DAC generates a baseband signal.

In accordance with an aspect, the method further comprises using a radio frequency (RF) attenuator, operating in current mode, with the DAC, the baseband filter and the upconverting mixer.

In accordance with an aspect, the method further comprises using an output component, operating in current mode, with the DAC, the baseband filter, the upconverting mixer and the RF attenuator.

In accordance with an aspect, the method further comprises an offset component that applies current mode offset cancellation to facilitate local oscillator (LO) leakage signal reduction, wherein at least one of the DAC, the baseband filter, the upconverting mixer, the output component, the RF attenuator or the offset component is a cryo-electronic component.

In accordance with an aspect, the method further comprises using two or more DACs in quadrature, two or more upconverting mixers in quadrature and a summer that generates a summed output of respective output signals of the upconverting mixers.

In an embodiment, a computer program product comprising a computer readable storage medium having program instructions embodied therewith, the program instructions executable by a processor to cause the processor to: use a digital to analog converter (DAC) operating in current mode; and use an upconverting mixer, operating in current mode and operatively coupled to the DAC, wherein analog inputs and analog outputs of the DAC and the upconverting mixer are represented as currents, and the DAC generates a baseband signal.

In accordance with an aspect of the computer program product, the program instructions are executable by the processor to further cause the processor to use a radio frequency (RF) attenuator, operating in current mode, with the DAC and the upconverting mixer.

DETAILED DESCRIPTION

Figure 1:
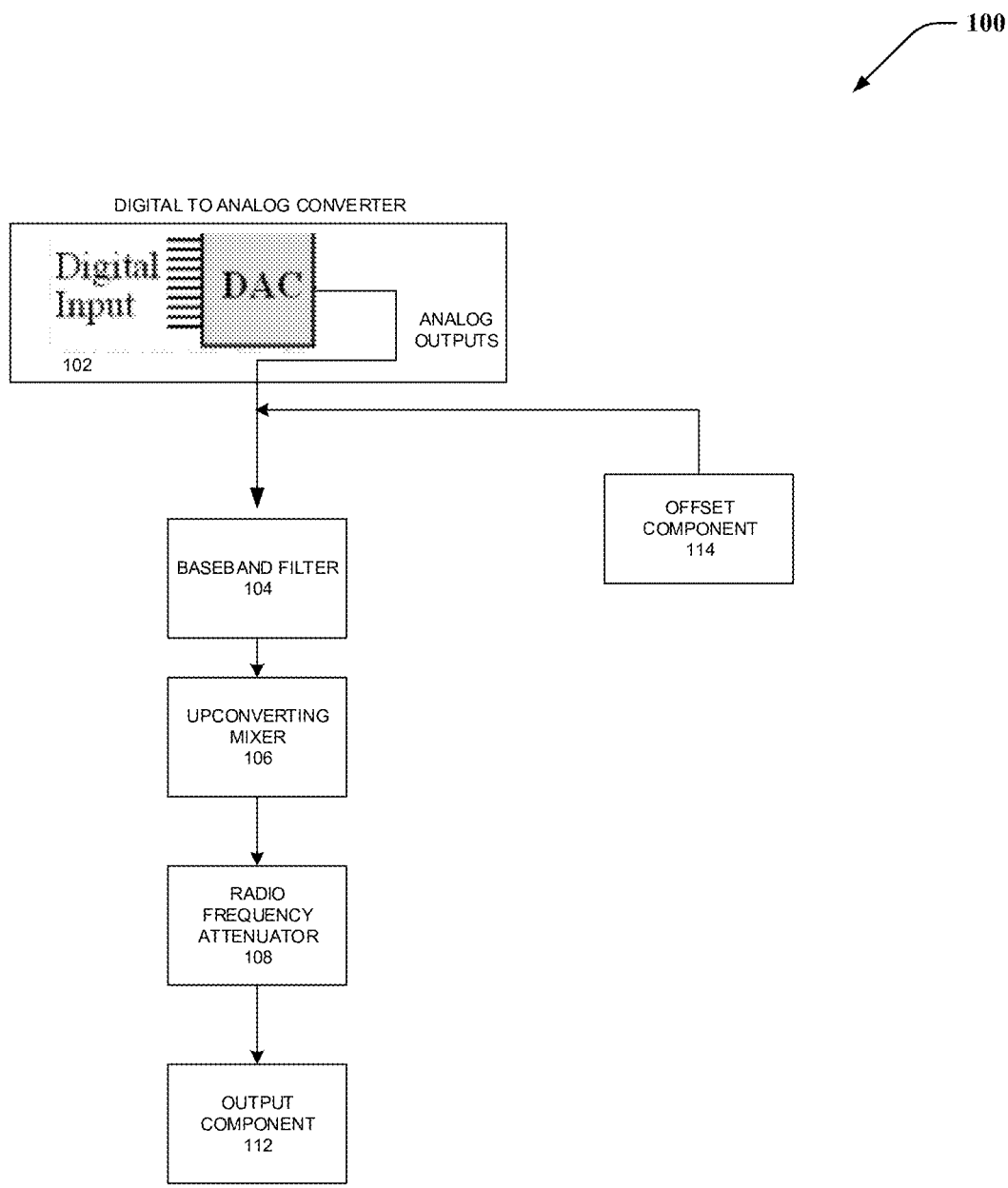
FIG. 1 illustrates a block diagram of an example system implementation that implements an integrated radio frequency (RF) pulse generator utilizing a current-mode signal path.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The subject disclosure relates generally to RF pulse generator systems and methods that implement a current mode end-to-end path from a digital to analog converter (DAC) through an output which enables realization of a favorable set of trade-offs regarding power consumption and distortion. Elements of a signal path are a DAC, baseband filter, mixer, attenuator, and an output chain component. Benefits can be achieved by implementing an entire chain in current mode. It is to be appreciated that embodiments can optionally utilize radio frequency digital to analog converters (RFDACs).

Embodiments integrate an RF pulse generator utilizing a current mode transconductance capacitance filter that receives an output current from a DAC and generates a filtered current. Current mode signal processing is well suited for low distortion applications, as it reduces voltage swings at various nodes of interest. Another benefit of current-mode circuits is that they make possible current reuse, in which the bias and signal currents of one stage are shared with another stage (typically by stacking the circuit stages). Since reuse decreases the total current drawn from the power supply, circuit power efficiency is improved. However, traditional current mode input filters using an operational amplifier consume significant amount of power and have limitations to high frequency applications. Embodiments disclosed and claimed herein propose a promising solution to this problem by introducing a current mode signal path design in implementation of an integrated RF pulse generator. Implementing an efficient current-mode filter stage may be a key part of realizing the proposed end-to-end current mode signal path, which has been developed for low-power consumption through leverage of current reuse and enhances end-to-end linearity by minimizing voltage-to-current and current-to-voltage conversion. Low output signal requirements are an advantage to a system in implementing a signal chain efficiently. Moreover, the integrated RF pulse generator solution enables cascaded solutions using current mode approaches.

Quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle+\beta|1\rangle$, where $\alpha$ and $\beta$ are complex scalars (such that $|\alpha|^2+|\beta|^2=1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It's not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1. General quantum programs require coordination of quantum and classical parts of a computation. One way to think about general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers may utilize several IRs during a process of translating and optimizing a program. An input is a source code describing a quantum algorithm and compile time parameter(s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactory probable certainty of solution can be achieved.

By processing information using laws of quantum mechanics, quantum computers offer novel ways to perform computation tasks such as molecular calculations, optical photons, optimization, and many more. Many algorithms and system components are introduced to perform such computational tasks efficiently. In particular, radio frequency (RF) pulse generators (often incorporating one or more digital to analog converters) are valuable in a variety of applications, including wireless transmitters and implementing control pulses for qubits. There are some challenges with designs that utilize voltage mode representations for a signal path which includes high dynamic range requirements at block interfaces, leading to nonlinear behavior and generation of higher amplitude distortion products. Another challenge is significant power consumption per block, with no opportunity for power efficiency that comes from current reuse. Thus, embodiments herein propose a current mode end-to-end signal path to facilitate realization of a favorable set of trade-offs regarding power consumption and distortion. These benefits can be best achieved by implementing the entire chain in current mode.

FIG. 1 illustrates a block diagram of an example system 100 that can access data and process that data using variable computing components depicted in accordance with one or more embodiments described herein. The system 100 can facilitate a process of assessing and identifying large amounts of various forms of data, using machine learning, and training a neural network or other type of model. The system 100 can also generate predictive recommendations to an individual level with context in accordance with one or more embodiments described herein. Aspects of systems (e.g., system 100 and the like), apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform operations described herein. Repetitive description of like elements employed in one or more embodiments described herein is omitted for sake of brevity.

The system 100 facilitates an integrated radio frequency (RF) pulse generator utilizing a current mode signal path. Embodiments relate to maintaining elements of a signal path, a digital to analog converter (DAC) 102, baseband filter 104, upconverting mixer 106, radio frequency (RF) attenuator 108, an output component 112 (e.g., a current mode amplifier), and an offset component 114. Benefits can be achieved by implementing an entire chain in current mode. Although FIG. 1 depicts utilization of the baseband filter 104, the upconverting mixer 106, the RF attenuator 108, together, other embodiments can omit one or more of these components as well as cascade respective components in any suitable manner.

System 100 can optionally include a server device, one or more networks and one or more devices (not shown). The system 100 can also include or otherwise be associated with the digital to analog converter 102 operating in current mode wherein analog inputs and analog outputs of system blocks are represented as currents. The digital signal input to the DAC 102 can be, for example, baseband digital I and Q data representing any suitable signals such as, for example, signals for a wireless transmitter, signals for implementing control pulses for qubits, etc., but are not limited to such. The analog output of DAC 102 in the form of a current can be directed to a baseband filter 104. The baseband current output of the baseband filter 104 is frequency translated up to RF frequencies by an upconverting mixer 106, which is driven by a local oscillator (LO) signal. Optionally the LO signal waveform may use complementary metal-oxide-semiconductor (CMOS) rail-to-rail levels, such as those generated by a CMOS inverter. The radio frequency (RF) attenuator 108 operates with the DAC 102, baseband filter 104, and the upconverting mixer 106. Output component 112 receives an output current of the RF attenuator 108. In some embodiments, the output component 112 can include an impedance conversion component (e.g., a transformer or current-mode amplifier). The corresponding signal chain can produce an output current signal with the DAC 102, baseband filter 104, the upconverting mixer 106, and the RF attenuator 108. DC offsets in the baseband signals (for instance, DC offsets in the output currents of the baseband filter 104) are converted by the upconverting mixer to unwanted LO tones (LO "leakage") in the output of the RF pulse generator system 100. To suppress such LO leakage, DC offset cancellation can be applied by an offset component 114, which adds a compensating DC offset to the baseband signal. The DAC 102, the baseband filter 104, the upconverting mixer 106, the RF attenuator 108, the output chain component 112 or the offset component 114 can be cryo-electronic component(s) (e.g., electronic component(s) that can operate at cryogenic temperatures).

In an implementation, a current mode end-to-end path from the digital to analog converter (DAC) 102 through output component 112 facilitates realization of a favorable set of trade-offs regarding power consumption and distortion. In this signal path, the DAC 102 operating in current mode implements an integrated DAC solution wherein the baseband filter 104 incorporated with upconverting mixer 106 and RF attenuator 108 operate in current mode wherein analog input and analog output signals between system blocks are represented as currents. The upconverting mixer 106 is driven by an LO signal, which optionally may use complementary metal-oxide-semiconductor (CMOS) rail-to-rail levels. The radio frequency (RF) attenuator 108, operates with the DAC 102, baseband filter 104, and the upconverting mixer 106. This methodology can facilitate low output signal requirements to implement the signal chain efficiently. Thus, the current mode signal path of an integrated RF pulse generator solution may facilitate reduced power consumption through leverage of current reuse, enhance linearity by minimizing voltage-to-current and current-to-voltage conversion, and enable cascaded solutions using current mode approaches.

System 100 can be any suitable computing device or set of computing devices that can be communicatively coupled to devices, non-limiting examples of which can include, but are not limited to, a server computer, a computer, a mobile computer, a mainframe computer, an automated testing system, a network storage device, a communication device, a web server device, a network switching device, a network routing device, a gateway device, a network hub device, a network bridge device, a control system, or any other suitable computing device. A device can be any device that can communicate information with the system 100 and/or any other suitable device that can employ information provided by system 100. It is to be appreciated that system 100, components, models or devices can be equipped with communication components (not shown) that enable communication between the system, components, models, devices, etc. over one or more networks.

The various components of system 100 can be connected either directly or via one or more networks. Such networks can include wired and wireless networks, including, but not limited to, a cellular network, a wide area network (WAN) (e.g., the Internet), or a local area network (LAN), non-limiting examples of which include cellular, WAN, wireless fidelity (Wi-Fi), Wi-Max, WLAN, radio communication, microwave communication, satellite communication, optical communication, sonic communication, or any other suitable communication technology. Moreover, the aforementioned system and/or devices have been described with respect to interaction between several components. It may be appreciated that such system and components can include these components or sub-components specified therein, some of the specified components or sub-components, and/or additional components. Sub-components may also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art.

The subject computer processing system(s), methods, apparatuses and/or computer program products can be employed to solve new problems that arise through advancements in technology, computer networks, the Internet and the like.

In today's digital world, one of the largest growth areas in electronics has been in applications of wireless communications. Modern radio frequency systems such as 3G/4G/5G base stations are based on wideband multi-channel architectures. To facilitate flexibility in signal generation, modulation, and processing, modern RF transmitters typically employ one or more high-speed digital to analog converters (DACs). Such high-speed DACs provide arbitrary waveform generation capability for RF signals, which is also useful in other applications. One such application is the control of qubits in the field of quantum computing, where there is a need for generating RF control pulses with variable amplitudes and low distortion (high spectral purity). Minimizing power consumption for such RF pulse generators is valuable, especially in the context of cryogenic signal generation for qubit control. A challenge with designs that utilize voltage mode representations for the signal path includes high dynamic range requirements at block interfaces, leading to nonlinear behavior and the generation of higher amplitude distortion products. Thus, these embodiments propose a promising solution to this problem by introducing a current mode signal path design in the implementation of an integrated RF pulse generator system. Through this way, as the impedance level is low, the signal swing is low, and the system 100 can operate with low supply voltage. For a given supply voltage, the dynamic range can be maximized, and the noise level can be one of if not the only limitation. Also, at an interface node, the overall impedance is smaller, which leads to larger bandwidth.

Figure 2:
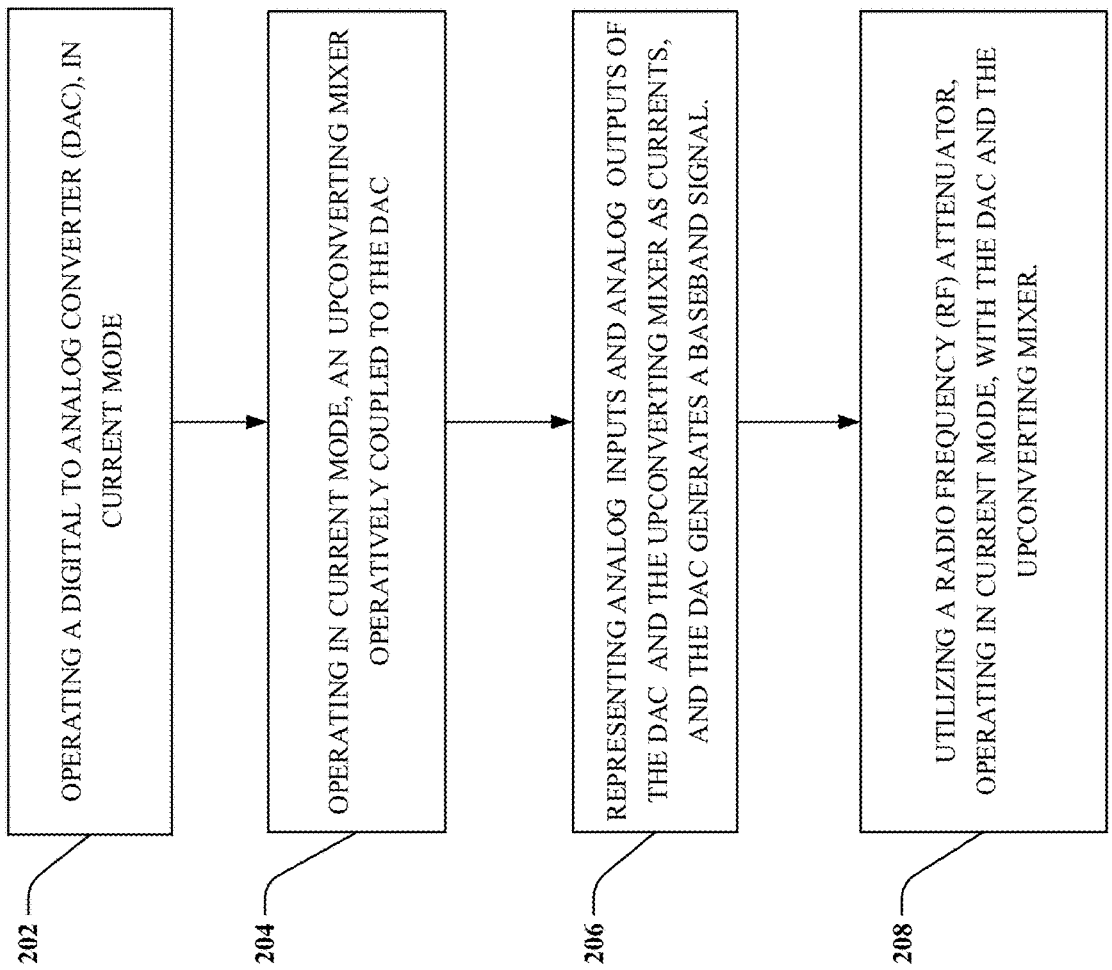
FIG. 2 illustrates an example framework of a methodology to integrate a radio frequency (RF) pulse generator utilizing a current mode end-to-end signal path.

FIG. 2 illustrates an example framework 200 of a methodology to integrate a radio frequency (RF) pulse generator utilizing a current mode end-to-end signal path. Facets of the framework are operating a digital to analog converter (DAC) in current mode at 202, and at 204 operating in current mode an upconverting mixer operatively coupled to the DAC. At 206, representing analog inputs and analog outputs of the DAC and the upconverting mixer as currents, and the DAC generates a baseband signal. At 208, the methodology utilizes a radio frequency (RF) attenuator, operating in current mode, with the DAC and the upconverting mixer. It is to be appreciated that subsets of steps 204, 206 or 208 can be optional. Thus, the framework provides for an entire chain that operates in current mode (or optionally implements sub-elements of the chain in current mode) by integrating a DAC interface to an upconverting mixer, and RF attenuator to generate an output. Functionality is implemented in current mode and any two blocks are also interfaced in current mode. A stage utilizes current mode signals and the signals can be attenuated and multiplied. Starting from the baseband filter, the current mode signals are scaled up/down in the circuit stages, at the interfaces between stages, and optionally in an impedance matching network wherein the impedance matching network is part of an output component stage. These methods may reduce end-to-end power consumption through leverage of current reuse and enhance end-to-end linearity (reduce distortion) by minimizing voltage-to-current and current-to-voltage conversion. Low output signal requirements aid to implement the signal chain efficiently, and the methods enable cascaded solutions using current mode approaches.

Figure 3:
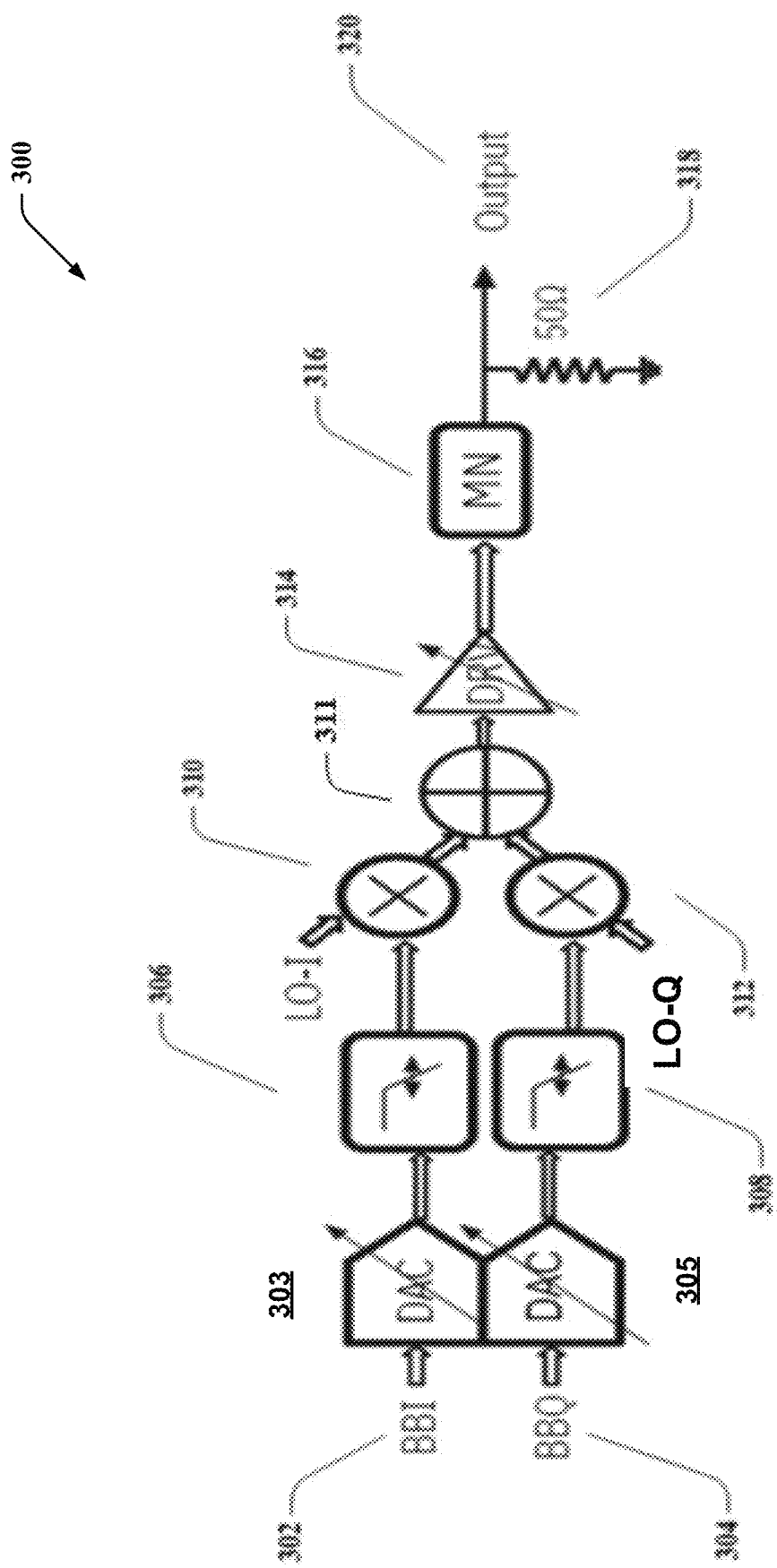
FIG. 3 illustrates an example architecture of a radio frequency (RF) pulse generator signal chain.

FIG. 3 illustrates an example architecture of an RF pulse generator signal chain including two or more DACs (303, 305) in quadrature, two or more base-band filters 306, 308 in quadrature, two or more upconverting mixers in quadrature and a summer that generates a summed output of respective output signals of the upconverting mixers. In this embodiment, and unlike conventional systems, it is to be appreciated that respective subblocks are implemented in current mode and all analog signals transferred between subblocks are represented as currents. It is to be appreciated that inputs (e.g., digital words) to the DACs (303, 305) are digital. One method to generate complex signals is to modulate a carrier signal frequency by a local oscillator using a vector modulator. In RF applications, baseband digital I and Q signals are generated using arbitrary waveform generators (AWGs) which contain two or more synchronized digital to analog converters (DACs). An RF pulse generator signal chain architecture 300 receives baseband digital BBI 302 and BBQ 304 signals. Multi-bit baseband digital to analog converters (DACs) 303 and 305 employ digital bits and depending on the bandwidth of a signal and a sampling clock frequency, convert digital bits to an analog signal. This enables the output of a current and provides a filtered and amplified current to the upconverting mixers 310 and 312. Signals are processed through low pass filters 306 and 308 to reject out-of-band noise components resulting from the DACs (303, 305). The filtered signals are mixed and thus upconverted, by upconverting mixers 310 and 312, using two carriers (LO-Q and LO-I) having orthogonal phases 0 and 90 degrees for I and Q. Using a signal combiner 311, the resulting signals are combined by creating a single side band signal representation. For example, if (x*y) function needs to be performed in a single side band representation, then variable x can be represented as a combination of 0 and 90 degrees and variable y can be represented as a combination of 0 and 90 degrees. These two variables can then be multiplied and added, similar to the scalar product of two vectors. An output of this function is processed through a driver DRV 314. A matching network MN 316 is a component typically consisting of passive elements that do not add distortions. The matching network 316 transforms resistance 318 (e.g., 50 ohms) to an impedance the driver requires, in order to maximize power transfer. In the RF pulse generator system 300, the outputs of the DACs (303, 305) are filtered and up-converted using I- and Q-channel mixers, and resulting signals are combined and fed through a driver and matching network to a nominal load (e.g., 50 ohm) at output 320. The filter implementation and the interface between the filter and the other elements of the signal chain are of significance in such designs. Continuous-time filters are well suited for high dynamic range, low power active filter implementations. Traditional current mode input filter using an operational amplifier consumes a significant amount of power and has limitations in high frequency applications. Continuous time $G_m$-C filters typically provide a high input impedance, which leads to higher distortion products. A $G_m$-C type filter is well suited for high frequency applications but is quite limited in terms of the dynamic range it supports as its input is typically a voltage.

Current mode signal processing is well suited for low distortion applications, as it reduces voltage swings at various nodes of interest. Another benefit of current-mode circuits is current reuse, in which bias and signal currents of one stage are shared with another stage (e.g., typically by stacking circuit stages). Since reuse decreases total current drawn from a power supply, circuit power efficiency is improved. However, conventional current mode input filters, e.g., using an operational amplifier consume significant amount of power and have limitations to high frequency applications. An efficient current-mode filter stage can facilitate realizing an end-to-end current mode signal path for low-power consumption through leverage of current reuse and can enhance end-to-end linearity by minimizing voltage-to-current and current-to-voltage conversion. Low output signal requirements are an advantage to implementing a signal chain efficiently.

Figure 4:
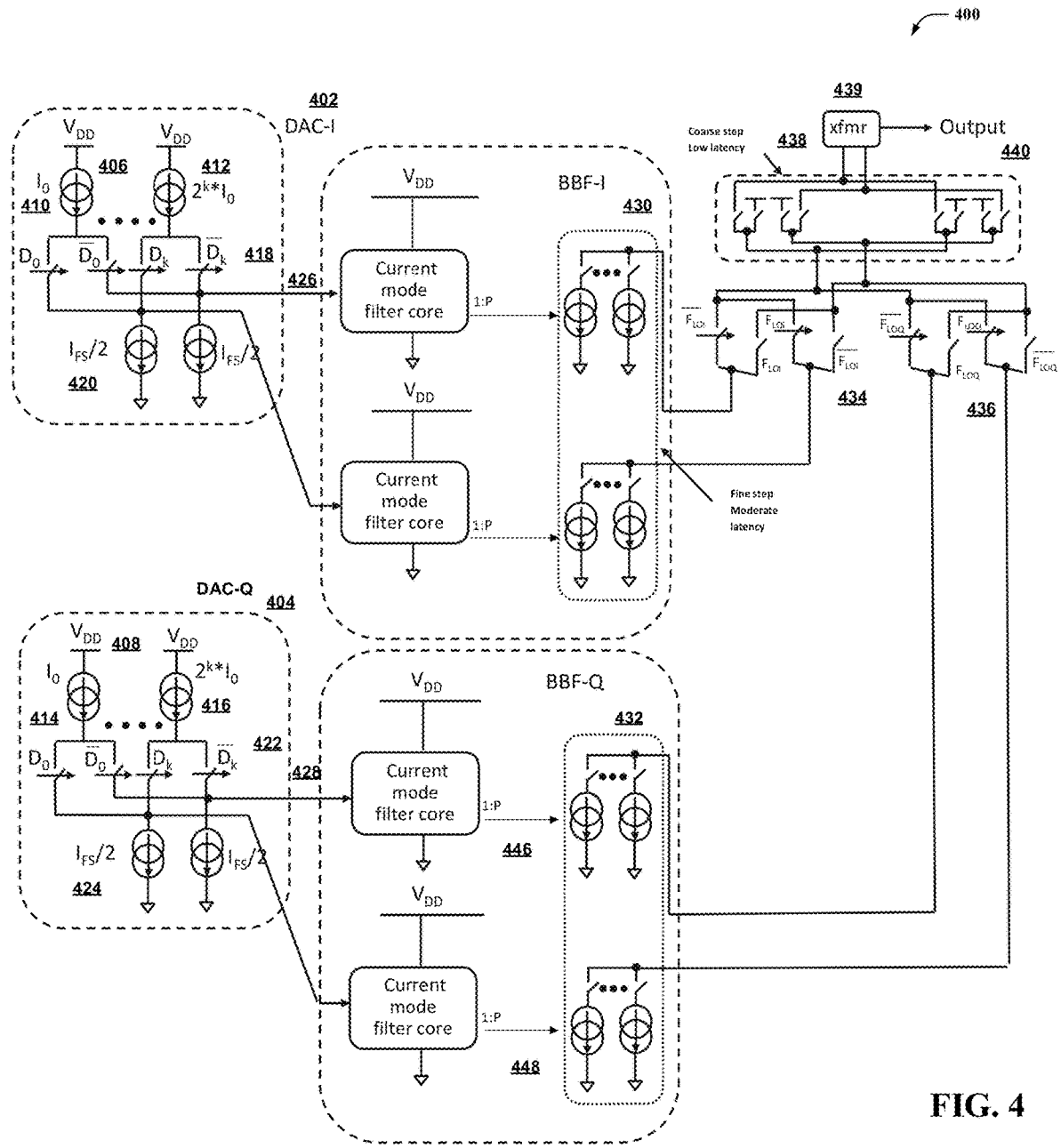
FIG. 4 illustrates an example architecture of a current-mode implementation of the end-to-end signal path from digital-to-analog converter (DAC) to output.

FIG. 4 illustrates an example architecture of a current-mode implementation of the end-to-end RF pulse generator signal path from DAC to output. The architecture described in 400 is a simplified view of the current mode implementation wherein two DACs (DAC-I 402 and DAC-Q 404) are utilized to generate I and Q portions of a baseband signal. With voltage $V_{DD}$ 406, 408 and the binarily scaled current sources $I_{0 \ldots k}$, 410, 412, 414 and 416, differential current switches 418 and 422 operating at a sampling frequency of Fs are used to generate DAC outputs 426 and 428 that are proportional to binary input codes. While the differential current switches inject unipolar currents into the DAC outputs 426 and 428, the net currents injected into DAC outputs 426 and 428 can be centered around zero (bipolar current signaling) by subtracting off DC currents with current sources 420 and 424. These currents are set to $I_{FS}/2$, where $I_{FS}$ is the full-scale current range of the DAC. The use of current mode architecture allows this subtraction of DC currents with simple "dotting" of the current sources.

The DAC outputs 426 and 428 are currents and are delivered to two differential baseband filters BBF-I 430 and BBF-Q 432. The output of the baseband filter provides some scaling of current by using multiple current sources in parallel. It is to be appreciated that current reuse can be effected as output currents of baseband filters 430, 432 provide bias currents for upconverting mixers 434, 436 as well as an RF attenuator 438. This is typically performed by current mirrors that are known and then the output current goes through the upconverting mixers 434 and 436 that are driven by in-phase local oscillator (LO) signal $F_{LOI}$ and quadrature LO signal $F_{LOQ}$. The output of the upconverted current from the mixers proceeds to an RF attenuator 438, which works by dumping some of the upconverted current to the positive power supply (away from the output load); the amount of attenuation achieved depends on how many of the differential current switches are steered to dump their output currents. The use of discrete differential current switches allows the attenuation to be switched with low latency and in coarse step sizes. (For finer but slower changes in gain and signal level, one can change the number of active current sources producing the output currents of baseband filters 430 and 432, so that the 1:P current mirror ratio is programmable.) The current attenuation provided by RF attenuator 438 weakens both the signal and noise by a scalar quantity such that there is no loss of dynamic range. The output of the RF attenuator 438 is delivered to an output component (e.g., 112, FIG. 1), which in this case is an impedance matching transformer 439 that provides differential-to-single-ended conversion (i.e., a balun function). Based on the turns ratio of the transformer 439, it can also provide passive current amplification (PCA). The PCA transformer is a passive current amplification block, and it employs differential input signal in terms of current and provides single ended output to the 50 ohms load. At this final stage, the current mode signaling is converted to some (relatively small) amount of voltage swing. This architecture is one combination wherein attenuation is performed in series of the current path. Current attenuation and multiplication can be performed in many series and parallel combinations based on the available voltage headroom and linearity requirements.

Figure 5:
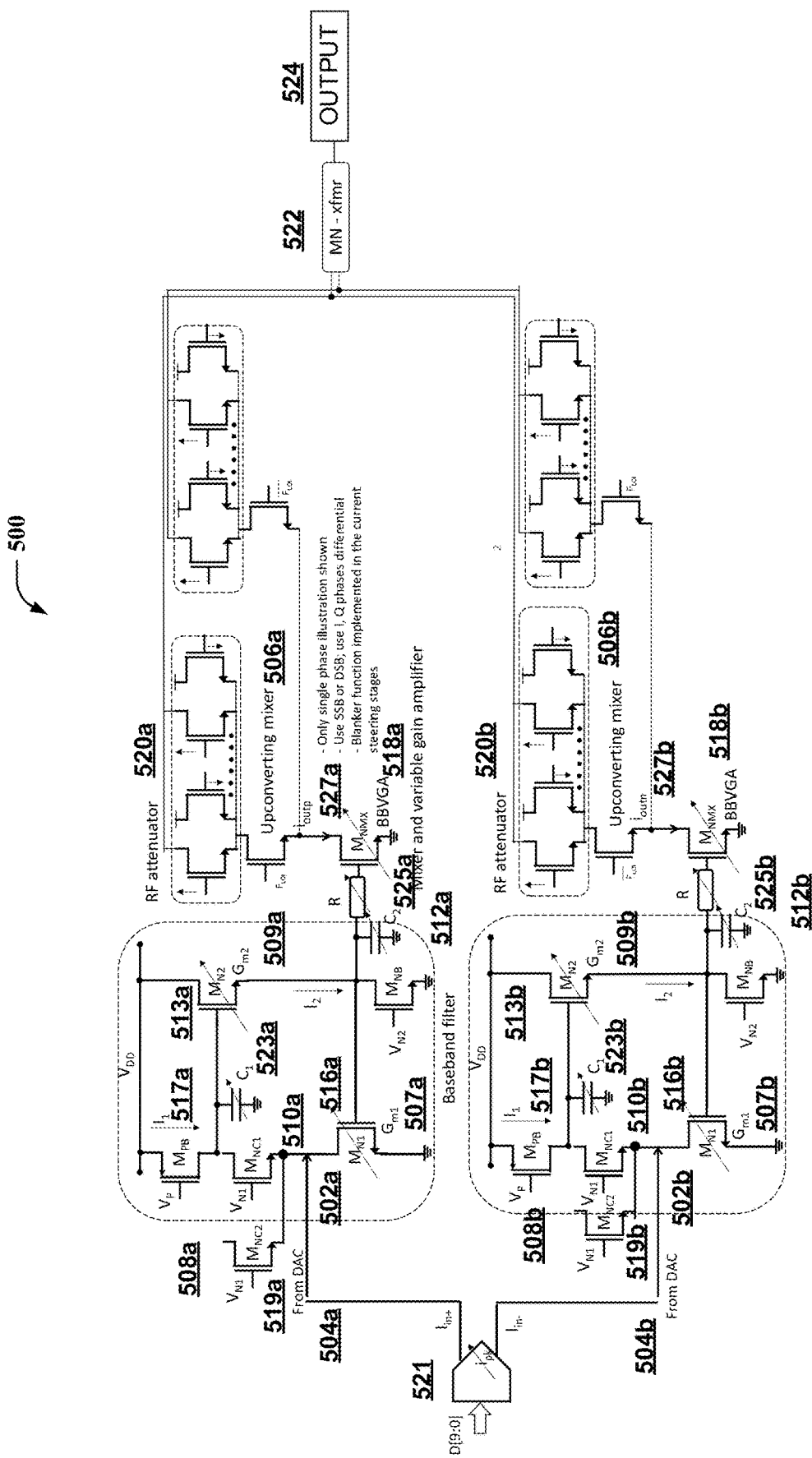
FIG. 5 illustrates an example schematic of a transistor level implementation of the baseband filter, the upconverting mixer, and the radio frequency (RF) attenuator.

FIG. 5 illustrates an example schematic of a transistor level implementation 500 of an RF pulse generator system for a single phase (I) RF output signal. (As indicated in the block diagram of FIG. 4, parallel copies of these transistor circuits could be used to generate a quadrature (Q) RF signal component.) To generate differential signals, the transistor level implementation 500 is formed from two half circuits, with an upper half circuit generating the positive signals (e.g., $i_{outp}$), and a lower half circuit generating the negative signals (e.g., $i_{outm}$). Like components of the two halves are identified by same reference number with script "a" for the upper half and script "b" for the lower half. For sake of brevity, these components will be described herein utilizing respective reference numbers without scripts. The implementation 500 comprises a baseband filter 512, an upconverting mixer 506, and an RF attenuator 520. The embodiment of the baseband filter 512 shown in FIG. 5 is similar to a conventional Gm-C filter, in that its frequency response depends on the values of transconductance ($G_m$) and capacitance (C). As shown in the figure, $G_{m1}$ 507 and $G_{m2}$ 509 each represent transconductance of a transistor and $C_1$ 523 and $C_2$ 525 represent capacitors.

In this embodiment, input current mode interfaces for currents $i_{in}$ 502, which receive input from digital to analog converter (DAC) 521, are provided by exemplary baseband filters with a low input impedance suitable for a current mode interface that is provided by common-gate stage $M_{NC1}/M_{NC2}$ (510, 519), whereas conventional continuous time $G_m$-C filters typically provide a high input impedance. A negative feedback loop implemented with transistors $M_{N2}$ 513 and $M_{N1}$ 516 further reduces the input impedance at low frequencies (within the loop bandwidth) by adjusting the current through $M_{NC1}$ 510 so that it matches that of current source device $M_{PB}$ 517. This stabilizes the gate-to-source voltage of $M_{NC1}$ 510, which results in a very low input impedance. It also stabilizes the current through transistor $M_{NC2}$ 519. By Kirchhoff's current law (KCL), if the currents through $M_{NC1}$ 510 and $M_{NC2}$ 519 are stabilized (held constant), a change in the input current $i_{in}$ 502 is directly reflected in an equal change in the current through transistor $M_{N1}$ 516. At higher frequencies, two poles are introduced by capacitors namely $C_1$ 523 and $C_2$ 525, so that the current through $M_{N1}$ 516 represents a (lowpass) filtered version of the input current $i_{in}$ 502. The filtering provided by these two poles is classically known as a biquadratic filter, which has a second order transfer function. Once filtering is executed, an active gain is obtained from current mirror transistors $M_{N1}$ 516 and $M_{NMX}$ 518 (e.g., used as a baseband VGA, or BBVGA). A ratio of these two transistors provides a current gain and thus realizes an active gain block. As indicated in the figure, the transistor widths (numbers of active fingers) can be varied to provide a programmable current gain. In context of a transmitter, filtering is performed first and then a current gain is obtained. The order can be changed for processing smaller signals or low sensitivity. This is an enabling technique for a current mode architecture. The output current $i_{out}$ 527 of transistor $M_{NMX}$ 518 (e.g., used as BBVGA) is then delivered in a straightforward way to the upconverting mixer 506 and RF attenuator 520 stages. The output current of the RF attenuator 520 then proceeds to an output component (112, FIG. 1), which in this case is a matching network transformer MN-xfmr 522. Finally, the matching network transformer MN-xfmr 522 provides the RF signal to output 524. As described in this schematic, any stage of implementation utilizes current mode signaling, and a block is interfaced in current mode. A signal can be attenuated and multiplied and thus components shown in a traditional architecture realize current gain wherein gain can be greater than unity or less than unity. Starting from a baseband filter, a current interface can be scaled up/down with the current mode (for instance, by varying the widths of transistors $M_{N1}$ 516 and $M_{NMX}$ 518). The parameters (e.g., turns ratio) of the matching network transformer MN-xfmr 522 can be chosen to provide current gain as well.

Figure 6:
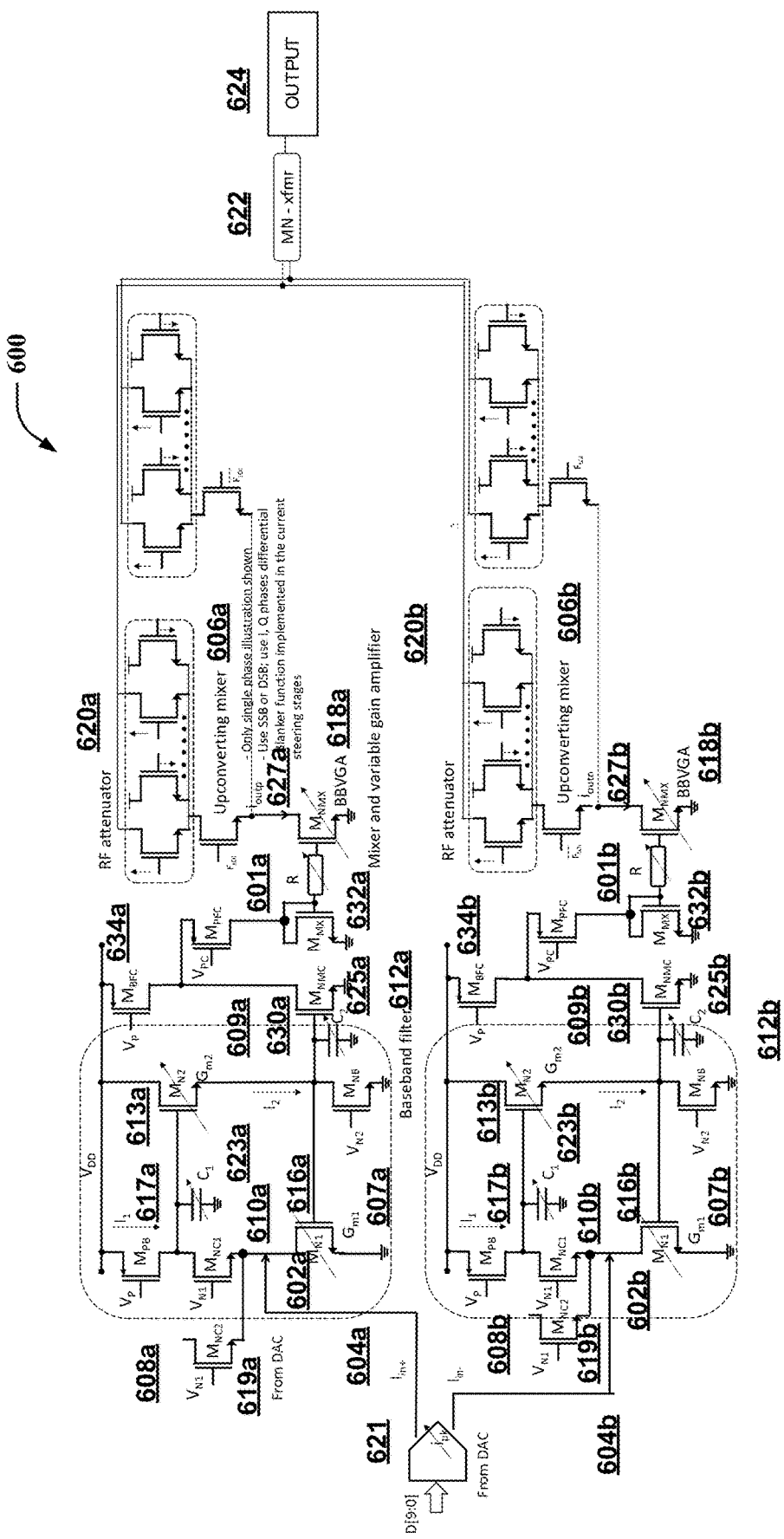
FIG. 6 illustrates an example schematic of a transistor level implementation of the baseband filter, the upconverting mixer, and the radio frequency (RF) attenuator.

FIG. 6 illustrates an example schematic of a transistor level implementation 600 of an RF pulse generator system for a single phase (I) RF output signal. (As indicated in the block diagram of FIG. 4, parallel copies of these transistor circuits could be used to generate a quadrature (Q) RF signal component.) To generate differential signals, the transistor level implementation 600 is formed from two half circuits, with an upper half circuit generating the positive signals (e.g., $i_{outp}$), and a lower half circuit generating the negative signals (e.g., $i_{outm}$) Like components of the two halves are identified by same reference number with script "a" for the upper half and script "b" for the lower half. For sake of brevity, these components will be described herein utilizing respective reference numbers without scripts. The implementation 600 is similar to the implementation 500 (FIG. 5) but employs an extra folded cascode stage 601 which comprises quiescent current adjusting elements that enable operation with different ratios of dynamic to quiescent current. The transistor level implementation 600 comprises a baseband filter 612, an upconverting mixer 606, and an RF attenuator 620. The embodiment of the baseband filter 612 shown in FIG. 6 is similar to a conventional Gm-C filter, in that its frequency response depends on the values of transconductance ($G_m$) and capacitance (C).

As shown in the illustration of transistor level implementation 600, $G_{m1}$ 607 and $G_{m2}$ 609 each represent transconductance of a transistor and $C_1$ 623 and $C_2$ 625 represent capacitors. In this embodiment input current mode interfaces for currents $i_{in}$ 602, which receive input from digital to analog converter (DAC) 621, are provided by exemplary baseband filters with a low input impedance suitable for a current mode interface that is provided by common-gate stage $M_{NC1}/M_{NC2}$ (610, 619), whereas conventional continuous time $G_m$-C filters typically provide a high input impedance. A negative feedback loop implemented with transistors $M_{N2}$ 613 and $M_{N1}$ 616 further reduces the input impedance at low frequencies (within the loop bandwidth) by adjusting the current through $M_{NC1}$ 610 so that it matches that of current source device $M_{PB}$ 617. This stabilizes the gate-to-source voltage of $M_{NC1}$ 610, which results in a very low input impedance. It also stabilizes the current through transistor $M_{NC2}$ 619. By Kirchhoff's current law (KCL), if the currents through $M_{NC1}$ 610 and $M_{NC2}$ 619 are stabilized (held constant), a change in the input current $i_{in}$ 602 is directly reflected in an equal change in the current through transistor $M_{N1}$ 616. At higher frequencies, two poles are introduced by capacitors namely $C_1$ 623 and $C_2$ 625, so that the current through $M_{N1}$ 616 represents a (lowpass) filtered version of the input current $i_{in}$ 602.

The filtering provided by these two poles is classically known as a biquadratic filter, which has a second order transfer function. Once filtering is executed, the current through transistor $M_{N1}$ 616 is transferred to the upconverting mixer 606 by known current mirror circuits. Because implementation 600 (in contrast with implementation 500) employs an extra folded cascode stage 601 in this path, there are now two current mirrors that can provide active current gain: a mirror formed by transistors $M_{N1}$ 616 and $M_{NMC}$ 630, and another mirror formed by transistors $M_{MX}$ 632 and $M_{NMX}$ 618. Together, these two current mirror stages can be used as a baseband VGA, or BBVGA, in which the current gain depends on the width ratio of transistors $M_{N1}$ 616 and $M_{NMC}$ 630, as well as the width ratio of transistors $M_{MX}$ 632 and $M_{NMX}$ 618. As indicated in the figure, the transistor widths (numbers of active fingers) can be varied to provide a programmable current gain. While the use of two current mirror stages provides additional flexibility in adjusting the current gain of the signal path, the main advantage of implementation 600 is that the addition of folded cascode stage 601 provides a mechanism for adjusting the ratio of dynamic (i.e., signal) current to quiescent (i.e., static bias) current. In particular, transistor $M_{BFC}$ 634 (acting as a current source) can be employed as a quiescent current adjusting element, for the difference between its DC bias current and that of transistor $M_{NMC}$ 630 determines the quiescent (i.e., static bias) current through $M_{MX}$ 632. In the case of a large current gain provided by current mirror transistors $M_{MX}$ 632 and $M_{NMX}$ 618, substantial power savings can be achieved by reducing the quiescent current through $M_{MX}$ 632 (which increases the ratio of dynamic current to quiescent current), as the upconverting mixer 606 and the RF attenuator 620 operate at smaller DC current levels. This is an enabling technique for a current mode architecture with improved power efficiency.

The output current $i_{out}$ 627 of transistor $M_{NMX}$ 618 (e.g., used as BBVGA) is then delivered in a straightforward way to the upconverting mixer 606 and RF attenuator 620 stages. The output current of the RF attenuator 620 then proceeds to an output component (112, FIG. 1), which in this case is a matching network transformer MN-xfmr 622. Finally, the matching network transformer MN-xfmr 622 provides the RF signal to output 624. As described in this schematic, any stage of implementation utilizes current mode signaling, and a block is interfaced in current mode. A signal can be attenuated and multiplied and thus components shown in a traditional architecture realize current gain wherein gain can be greater than unity or less than unity. Starting from a baseband filter, a current interface can be scaled up/down with the current mode (for instance, by varying the widths of transistors $M_{N1}$ 616, $M_{NMC}$ 630, $M_{MX}$ 632, and $M_{NMX}$ 618). The parameters (e.g., turns ratio) of the matching network transformer MN-xfmr 622 can be chosen to provide current gain as well.

Figure 7:
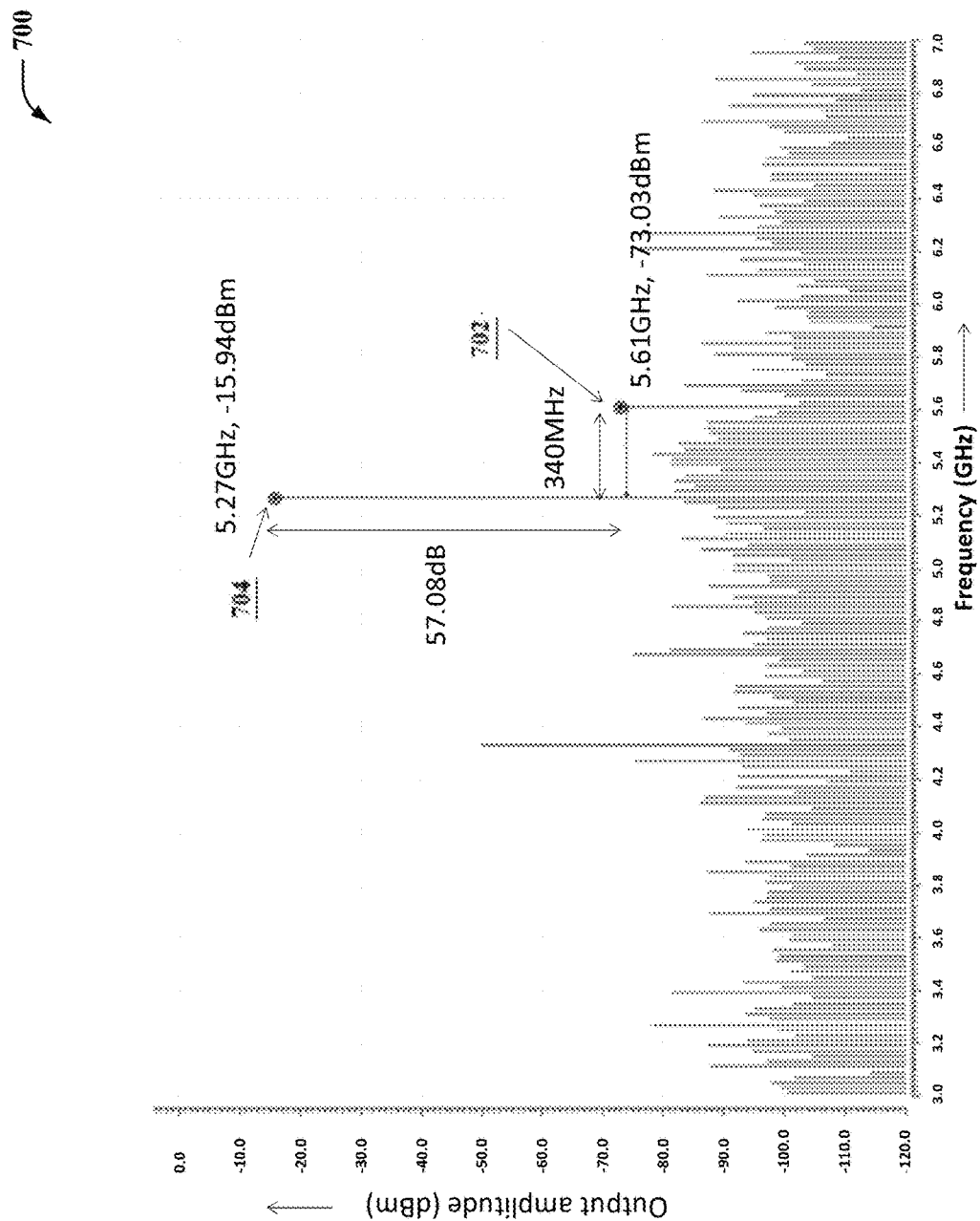
FIG. 7 illustrates an example simulation result of the overall radio frequency (RF) pulse generator signal chain.

FIG. 7 illustrates an example simulation result of an overall radio frequency pulse generator signal chain; the spectrum shown in the figure is obtained by performing a fast Fourier transform (FFT) of the output signal. In the circuit simulation, a 10-bit DAC operating at a sampling rate of 1 GHz generates an 85 MHz sinusoidal input that is applied to the current mode end-to-end signal path. The upconverting mixer is driven by a 5.355 GHz LO signal. The I and Q signals are chosen to produce a lower sideband tone 704 at a frequency 5.355-0.085=5.27 GHz. As shown in the simulation result 700, over a 1 GHz-wide band (4.5 to 5.5 GHz), the largest distortion product 702 is 57 dB below the desired tone 704, so the simulated spur-free dynamic range (SFDR) is 57 dB. Over the same 1 GHz-wide band, the simulated signal-to-noise-and-distortion ratio (SNDR) is 52.7 dB. Considering that the signal-to-noise ratio (SNR) of an ideal 10-bit DAC is only 62 dB, the simulated SFDR and SNDR numbers represent excellent performance, especially for such a power-efficient implementation. Conventional techniques have implemented similar functionalities with voltage mode single sideband (SSB) up-converter, voltage gated RF attenuator, operational transconductance amplifier (OTA) based baseband filter, and standard high input impedance $G_m$-C filter implementation. The voltage mode SSB up-converter causes non-linearity. A voltage gated RF attenuator introduces signal loss as well as extra circuit loading. An OTA based baseband filter implementation uses higher power and area. Lastly, a standard high input impedance $G_m$-C filter implementation is more non-linear. However, embodiments disclosed herein facilitate cascaded solutions using current mode approaches and enable an input current mode interface. Moreover, embodiments proposed here enhance end-to-end linearity and reduce distortion by minimizing voltage-to-current and current-to-voltage conversion. Also, these embodiments take advantage of low output signal requirements and leverage current steering to minimize signal loss in the signal chain. Lastly, these embodiments utilize less area and power by mirroring currents, creating a natural bridge between baseband current output and RF current input. This can reduce end-to-end power consumption through current reuse.

The current mode solution offers a path to current reuse and low distortion that are well-tuned to the requirements of cryogenic waveform generation. In these embodiments, in contrast to conventional techniques, voltage is only generated at a final output, and the rest of the stages are interfaced with low impedance, thereby leading to high linearity and high bandwidth. The techniques described in the instant disclosure are applicable to other high bandwidth communication systems as well and may be implemented in commercially available CMOS technologies. The approaches of exemplary embodiments described here provide an innovative strategy for implementing CMOS control pulse generation analog circuits to enable enhanced scalability of future quantum computing systems and can serve as a building block for cryo-CMOS implementations.

Figure 8:
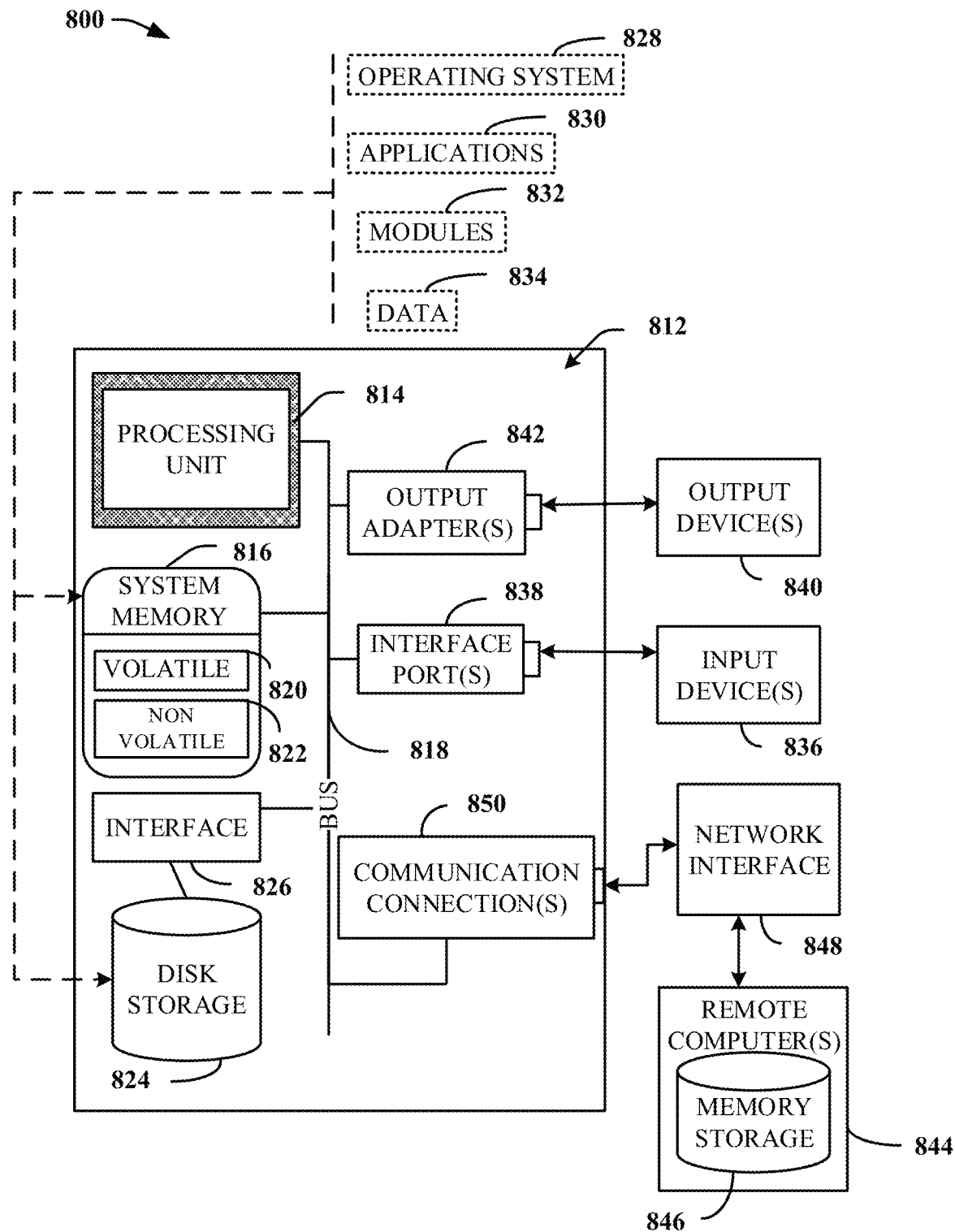
FIG. 8 illustrates a block diagram of an example, non-limiting, operating environment in which one or more embodiments described herein can be facilitated.

To provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and non-volatile memory 822. The basic input/output system (BIOS), containing the basic routines to transfer information between elements within the computer 812, such as during start-up, is stored in non-volatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It is to be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor-based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
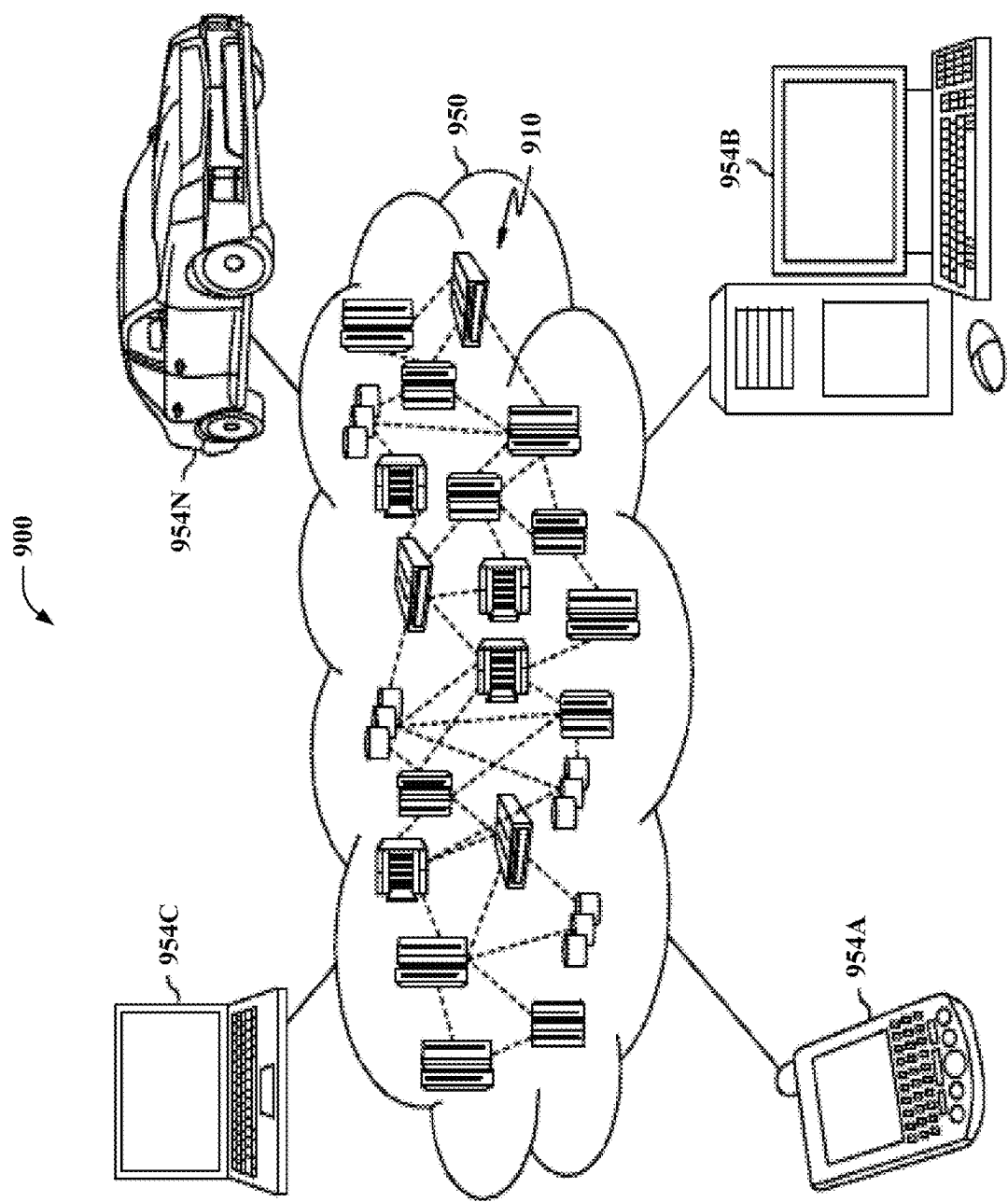
FIG. 9 illustrates a block diagram of an example, non-limiting, cloud computing environment in accordance with one or more embodiments of the subject disclosure.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, etc.) with which local computing devices used by cloud consumers can communicate. Nodes 910 may communicate with one another. It may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
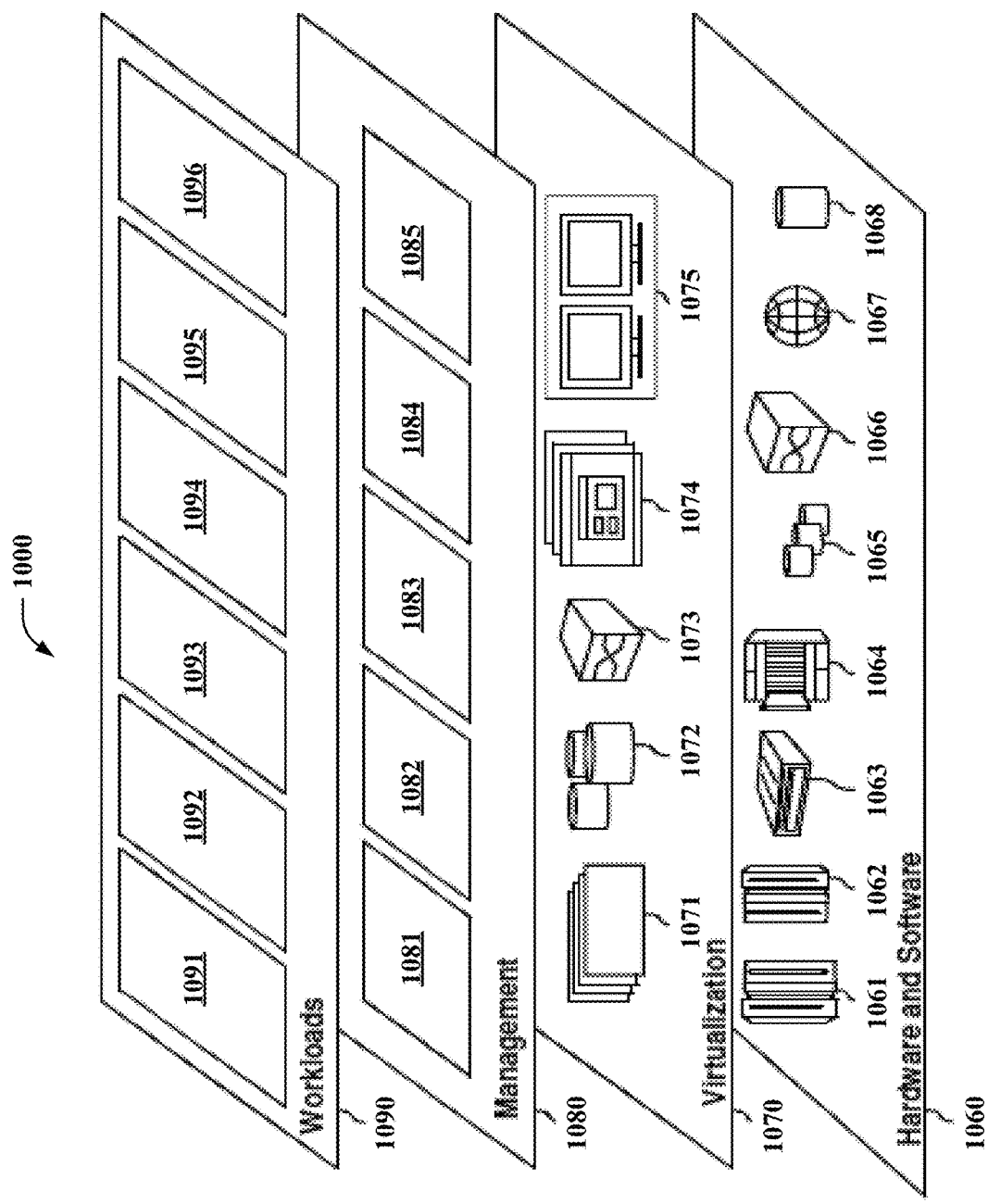
FIG. 10 illustrates a block diagram of example, non-limiting, abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture-based servers 1062; servers 1063; blade servers 1064; storage devices 1065; and networks and networking components 1066. In some embodiments, software components include network application server software 1067, quantum platform routing software 1068, and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and quantum state preparation software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It can be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It can also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or non-volatile memory, or can include both volatile and non-volatile memory. By way of illustration, and not limitation, non-volatile memory can include read only memory (ROM), programmable ROM (PROM), electrically programmable ROM (EPROM), electrically erasable ROM (EEPROM), flash memory, or non-volatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for generating a radio-frequency signal (RF), comprising:
a circuit that implements a current mode signal path end to end from digital to analog (DAC) converter to output component and comprising:
a digital to analog converter (DAC) that operates in current mode;
an upconverting mixer, that operates in current mode and operatively coupled to the DAC, wherein analog inputs and analog outputs of the DAC and the upconverting mixer are represented as currents, wherein all analog signals transferred between all subblocks of the system are represented as currents, and wherein the DAC generates a baseband signal; and
an RF attenuator coupled to the upconverting mixer, wherein the DAC, the upconverting mixer and the RF attenuator are cryo-electronic components, wherein the current mode signal is converted to voltage swing and voltage is only generated at an output of a final stage from the circuit.

2. The system of claim 1, further comprising an output component, that operates in current mode, with the DAC, the upconverting mixer and the RF attenuator.

3. The system of claim 1, further comprising:
an offset component that applies current mode offset cancellation to facilitate local oscillator (LO) leakage signal reduction.

4. The system of claim 2, further comprising an offset component that applies current mode offset cancellation to facilitate local oscillator (LO) leakage signal reduction, wherein at least one of the output component or the offset component is also a cryo-electronic component.

5. A system for generating a radio-frequency (RF) signal, comprising:
a RF pulse generator circuit that implements a current mode signal path end to end from digital to analog (DAC) converter to output component and comprising:
the DAC that operates in current mode and outputs currents to a plurality of current mode filter cores;
a baseband filter, of a plurality of baseband filters, the baseband filter coupled to and that receives outputs from the plurality of the current mode filter cores; and
an upconverting mixer of a plurality of upconverting mixers, the upconverting mixer operates in current mode and operatively coupled to the DAC, wherein analog inputs and analog outputs of the baseband filter, the DAC and the upconverting mixer are represented as currents, wherein all analog signals transferred between all subblocks of the system are represented as currents, and wherein the DAC generates a baseband signal, and
wherein the plurality of baseband filters scales currents received from the plurality of current mode filter cores by employing multiple current sources in parallel and providing current reuse as output currents from the plurality of baseband filters provide bias currents for the plurality of upconverting mixers and a RF attenuator, and wherein the current mode signal is converted to voltage swing and voltage is only generated at an output of a final stage from the circuit, wherein the system comprises a plurality of stages including the final stage, and remaining stages of the plurality of stages of the RF pulse generator circuit are interfaced with low impedance thereby leading to high linearity and high bandwidth.

6. The system of claim 5, wherein the radio frequency (RF) attenuator operates in current mode with the DAC, the baseband filter and the upconverting mixer, and wherein the RF attenuator receives upconverted current from the plurality of upconverting mixers and provides some of the upconverted current to a positive power supply and to the output component, and wherein the output component provides passive current amplification.

7. The system of claim 6, wherein the output component operates in current mode with the DAC, the baseband filter, the upconverting mixer and the RF attenuator.

8. The system of claim 5, further comprising an offset component that applies current mode offset cancellation to facilitate local oscillator (LO) leakage signal reduction.

9. The system of claim 7, further comprising an offset component that applies current mode offset cancellation to facilitate local oscillator (LO) leakage signal reduction, wherein at least one of: the baseband filter, the output component or the offset component is also a cryo-electronic component.

10. The system of claim 5, further comprising two or more DACs in quadrature, two or more of the plurality of upconverting mixers in quadrature and a summer that generates a summed output of respective output signals of the plurality of upconverting mixers.

11. A method, comprising:
operating a circuit that implements a current mode signal path end to end from digital to analog (DAC) converter to output component, wherein the operating the circuit comprises:
operating a digital to analog converter (DAC) in current mode;

operating an upconverting mixer, in current mode and operatively coupled to the DAC, wherein analog inputs and analog outputs of the DAC and the upconverting mixer are represented as currents, wherein all analog signals transferred between all subblocks of the system are represented as currents, and the currents between all subblocks have a same value, and wherein the DAC generates a baseband signal, wherein the DAC, the upconverting mixer and a radio-frequency (RF) attenuator coupled to the upconverting mixer are cryo-electronic components; and generating voltage only at an output of a final stage from the RF generator circuit.

12. The method of claim 11, further comprising operating a radio frequency (RF) attenuator, in current mode, with the DAC and the upconverting mixer.

13. The method of claim 12, further comprising operating the output component, in current mode, with the DAC, the upconverting mixer and the RF attenuator.

14. The method of claim 13, further comprising an offset component applying current mode offset cancellation to facilitate local oscillator (LO) leakage signal reduction.

15. The method of claim 14, wherein at least one of the output component or the offset component is a cryo-electronic component.

16. A method, comprising:
operating a circuit that implements a current mode signal path end to end from digital to analog (DAC) converter to output component, wherein the operating the circuit comprises:
  operating a digital to analog converter (DAC) of the circuit in current mode;
  operating a baseband filter, of a plurality of baseband filters of the circuit, and an upconverting mixer of a plurality of upconverting mixers of the circuit, in current mode and operatively coupled to the DAC, wherein analog inputs and analog outputs of the DAC, the current mode filter cores, the baseband filter and the upconverting mixer are represented as currents, wherein all analog signals transferred between all subblocks of the system are represented as currents, and wherein the DAC generates a baseband signal;
  scaling by the plurality of baseband filter currents received from the DAC by employing multiple current sources in parallel;
  providing current reuse as output currents from the plurality of baseband filters provide bias currents for the upconverting mixers and the RF attenuator, and
  converting the current mode signal to voltage swing and generating voltage at an output of a final stage from the circuit, wherein the circuit comprises a plurality of stages including the final stage, and remaining stages of the plurality of stages of the circuit are interfaced with low impedance thereby leading to high linearity and high bandwidth.

17. The method of claim 16, further comprising operating a radio frequency (RF) attenuator, in current mode, with the DAC, the baseband filter and the upconverting mixer.

18. The method of claim 17, further comprising operating an output component, in current mode, with the DAC, the baseband filter, the upconverting mixer and the RF attenuator.

19. The method of claim 18, further comprising operating an offset component that applies current mode offset cancellation to facilitate local oscillator (LO) leakage signal reduction, wherein at least one of the DAC, the baseband filter, the upconverting mixer, the output component, the RF attenuator or the offset component is a component that operates at cryogenic temperatures.

20. The method of claim 16, further comprising operating two or more DACs in quadrature, two or more of the plurality of upconverting mixers in quadrature and a summer that generates a summed output of respective output signals of the plurality of upconverting mixers.

21. A computer program product comprising a computer readable storage medium having program instructions embodied therewith, the program instructions executable by a processor to cause the processor to:
  operate, in a system, a radio frequency (RF) pulse generator circuit that implements a current mode signal path end to end from digital to analog (DAC) converter to output component, wherein the operation of the RF pulse generator circuit is based on program instructions executable to cause the processor to:
    operate, in the system, a DAC in current mode;
    operate, in the system, an upconverting mixer, in current mode, and operatively coupled to the DAC, wherein analog inputs and analog outputs of the DAC and the upconverting mixer are represented as currents, wherein all analog signals transferred between all subblocks of the system are represented as currents, and wherein the DAC generates a baseband signal,
  convert, in the system, the current mode signal to voltage swing;
  generate, in the system, voltage only at an output of a final stage from the RF pulse generator circuit of the system, wherein the system comprises a plurality of stages including the final stage, and remaining stages of the plurality of stages of the RF pulse generator circuit are interfaced with low impedance thereby leading to high linearity and high bandwidth.

22. The computer program product of claim 21, the program instructions executable by the processor to further cause the processor to operate a radio frequency (RF) attenuator, in current mode, with the DAC and the upconverting mixer.

* * * * *